US009196381B2

(12) United States Patent
Wang et al.

(10) Patent No.: US 9,196,381 B2
(45) Date of Patent: Nov. 24, 2015

(54) TECHNIQUE TO OPERATE MEMORY IN FUNCTIONAL MODE UNDER LBIST TEST

(71) Applicant: Futurewei Technologies, Inc., Plano, TX (US)

(72) Inventors: Zhiyuan Wang, Fremont, CA (US); Xiang Wu, Shenzhen (CN)

(73) Assignee: Futurewei Technologies, Inc., Plano, TX (US)

( * ) Notice: Subject to any disclaimer, the term of this patent is extended or adjusted under 35 U.S.C. 154(b) by 297 days.

(21) Appl. No.: 13/730,531

(22) Filed: Dec. 28, 2012

(65) Prior Publication Data

US 2014/0119144 A1 May 1, 2014

Related U.S. Application Data (60) Provisional application No. 61/721,200, filed on Nov. 1, 2012.

(51) Int. Cl.
*G11C 29/00* (2006.01)
*G11C 29/08* (2006.01)
(Continued)

(52) U.S. Cl.
CPC ............... *G11C 29/08* (2013.01); *G11C 29/12* (2013.01); *G11C 2029/0401* (2013.01)

(58) Field of Classification Search
CPC ........... G11C 2029/5602; G11C 29/56; G11C 29/56008; G11C 29/00; G11C 29/12; G06F 11/27; G06F 11/263; G06F 11/267; G06F 11/3055; G06F 13/4243; G06F 11/349; G01R 31/318555
USPC ......... 714/724, 763, 799, E11.001, 5.11, 718, 714/733, 734, E11.155, E11.159, 30, 719,714/703, 742; 365/201, 189.08, 200; 703/15; 702/117
See application file for complete search history.

(56) References Cited

U.S. PATENT DOCUMENTS 5,060,198 A * 10/1991 Kowalski ................. 365/185.12
6,032,268 A * 2/2000 Swoboda et al. ............... 714/30
(Continued)

FOREIGN PATENT DOCUMENTS

CN 1625782 A 6/2005
WO 03102963 A1 12/2003

OTHER PUBLICATIONS

Foreign Communication From a Counterpart Application, PCT Application No. PCT/CN2013/086440, International Search Report dated Feb. 20, 2014, 6 pages.
(Continued)

*Primary Examiner* — Phung M Chung
(74) *Attorney, Agent, or Firm* — Conley Rose, P.C.; Grant Rodolph; William H. Dietrich (57) ABSTRACT

A method for testing an integrated circuit having memory comprises performing a structural test on the integrated circuit using data obtained from operating the memory in a functional mode. In another embodiment, an integrated circuit comprises a memory mode selection module, a memory module, and an output selection module. The memory mode selection module is configured to receive a functional mode signal and a test mode signal, and selectively transmit either the functional mode signal or the test mode signal based on a state of a control signal. The memory module is configured to receive the signal from the memory mode selection module and store data corresponding to signal to memory cells. The output selection module is configured to receive the data from the memory cells, and transmit the data to downstream circuitry, which may use the data to perform a structural test, such as a logic built-in self-test.

20 Claims, 5 Drawing Sheets

(51) Int. Cl.
*G11C 29/12* (2006.01)
*G11C 29/04* (2006.01)

(56) References Cited

U.S. PATENT DOCUMENTS

| | | | |
|---|---|---|---|
| 6,519,724 | B1 | 2/2003 | Arnould |
| 7,263,639 | B2 * | 8/2007 | Athavale et al. .............. 714/726 |
| 7,266,743 | B2 * | 9/2007 | Athavale et al. .............. 714/727 |
| 8,418,008 | B2 * | 4/2013 | Chakravarty et al. ......... 714/731 |
| 2004/0064769 | A1 | 4/2004 | Gupte et al. |
| 2006/0075282 | A1 * | 4/2006 | Borkenhagen et al. ........... 714/5 |
| 2007/0204193 | A1 | 8/2007 | Grise et al. |
| 2009/0241124 | A1 * | 9/2009 | Denneau et al. .............. 718/105 |
| 2009/0327824 | A1 | 12/2009 | Alaniz et al. |
| 2012/0191400 | A1 * | 7/2012 | Sontakke et al. ............. 702/119 |
| 2014/0122928 | A1 * | 5/2014 | Wang et al. ..................... 714/27 |

OTHER PUBLICATIONS

Foreign Communication From a Counterpart Application, PCT Application No. PCT/CN2013/086440, Written Opinion dated Feb. 20, 2014, 5 pages.

* cited by examiner

TECHNIQUE TO OPERATE MEMORY IN FUNCTIONAL MODE UNDER LBIST TEST

CROSS-REFERENCE TO RELATED APPLICATIONS

This application claims priority to U.S. Provisional Application No. 61/721,200, filed Nov. 1, 2012 by Zhiyuan Wang et al. and entitled "Technique to Operate Memory in Functional Mode Under LBIST Test," which is incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Electronic components are commonly tested using a number of different techniques. For example, an integrated circuit may undergo a structural test on automated test equipment before being incorporated into a larger system, and then may undergo a performance test after being incorporated into the larger system. One challenge of testing electronic components is called no-trouble found (NTF). An NTF occurs when an electronic component passes a standalone structural test, but fails a functional test at a board or system level. Troubleshooting an NTF can be a challenging task, which may be due at least in part to difficulties in correlating structural test results to performance test results.

SUMMARY

In one embodiment, the disclosure includes a method for testing an integrated circuit having memory. The memory is set to operate in a functional mode. Data is written to and read from the memory while in the functional mode. The data is then used to perform a structural test (e.g., a logic built-in self-test) on the integrated circuit.

In another embodiment, an integrated circuit comprises a memory mode selection module, a memory module, and an output selection module. The memory mode selection module is configured to receive a functional mode signal and a test mode signal. The memory mode selection module is further configured to selectively transmit either the functional mode signal or the test mode signal based on a state of a control signal. The memory module is configured to receive either the functional mode signal or the test mode signal from the memory mode selection module and store data corresponding to either the functional mode signal or the test mode signal to memory cells in a memory core of the memory module. The output selection module is configured to receive the data from the memory cells and transmit the data to downstream circuitry, which may use the data to perform a structural test, such as a logic built-in self-test.

In yet another embodiment, an integrated circuit comprises memory and a processor. The processor is configured to perform a structural test on the integrated circuit using data obtained from operating the memory in a functional mode. The structural test may include a logic built-in self-test that is performed at-speed in an online environment and that is periodically repeated.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents. While certain aspects of conventional technologies have been discussed to facilitate the present disclosure, applicants in no way disclaim these technical aspects, and it is contemplated that the present disclosure may encompass one or more of the conventional technical aspects discussed herein.

Disclosed herein are systems and methods that enable operating memory in a functional mode while performing a structural test such as, but not limited to, a logic built-in self-test (LBIST). In one embodiment, logic circuitry is added to an integrated circuit (e.g., an application specific integrated circuitry) that enables the contents of a memory to be written to or read from in a functional mode while performing a structural test. Additionally, the added logic circuitry may be incorporated into the integrated circuit such that the same read and write paths that are used by the memory while in a functional mode are also used during the structural test. This may help improve test coverage by testing paths that are not normally tested. This may also improve correlations between structural and functional test results, which can assist in troubleshooting a component failure. Furthermore, test time can be reduced by combining the structural and performance tests and by being able to perform the testing at normal operating speeds (e.g., the test can be performed "at-speed"). Other features and advantages of embodiments are discussed in greater detail below and are shown in the accompanying figures.

Figure 1:
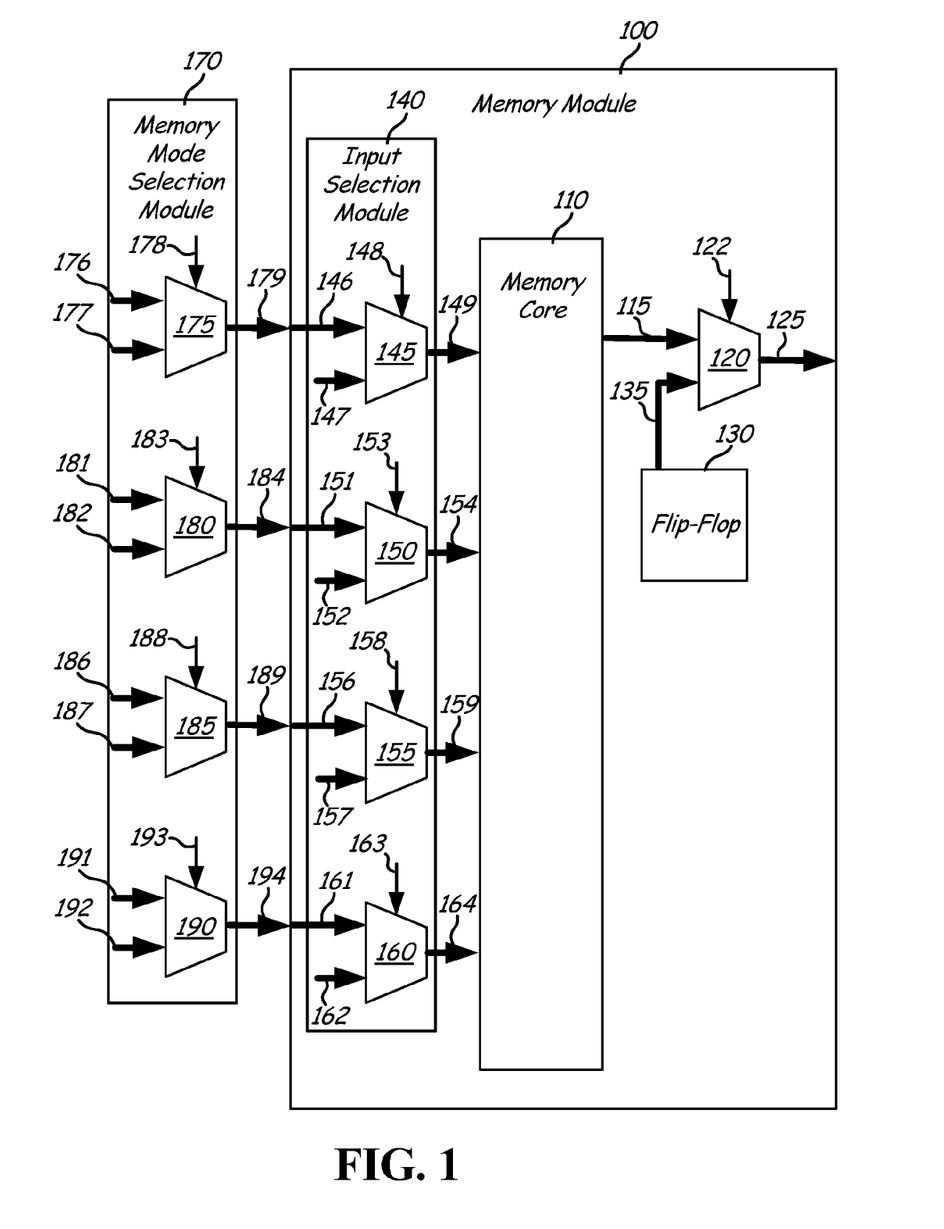
FIG. 1 is a schematic diagram of an embodiment of a memory module and a memory mode selection module.

FIG. 1 is a schematic diagram of an embodiment of a memory module 100 and a memory mode selection module 170. Memory module 100 can include any type of memory such as, but not limited to, static random access memory, dynamic random access memory, flash memory, and electrically erasable read only memory. Memory module 100 includes a memory core 110 having memory cells that can be written to and read from to store and retrieve data.

Memory module 100 may also include an output selection module 120. In one embodiment, output selection module 120 includes a 2-to-1 multiplexer. One of the multiplexer's inputs is connected to the memory core 110 through an interconnect 115, and the other one of the multiplexer's inputs is connected to a flip-flop 130 through an interconnect 135. A control signal 122 is used to select which one of the two inputs is output to the output interconnect 125. For instance, control signal 122 may be a DFTRAMBYPASS signal having a low state (e.g., logic value 0) and a high state (e.g., logic value 1). If the DFTRAMBYPASS signal is in the low state, the output interconnect 125 outputs the signal from the memory core interconnect 115, and if the DFTRAMBYPASS is in the high state, the output interconnect 125 outputs the signal from the flip-flop interconnect 135.

In some systems, flip-flop 130 includes data that is used to perform an LBIST. For example, an LBIST can be performed by setting the control signal 122 to transmit the data stored in flip-flop 130 to the output interconnect 125. The data from the flip-flop 130 is then used downstream by logic circuitry to perform the LBIST. Accordingly, when performing an LBIST in this manner, neither the memory core 110 nor its interconnect 115 are tested by the LBIST. However, as will be described in greater detail below, certain embodiments of the present disclosure set the control signal 122 to transmit the data stored in memory core 110 when performing an LBIST. Therefore, the memory core 110 and its interconnect 115 are tested during the LBIST instead of being bypassed during the test.

Memory module 100 may further include an input selection module 140. In one embodiment, memory module 100 has two input ports (e.g., port A corresponding to interconnects 179 and 189 and port B corresponding to interconnects 184 and 194), and input selection module 140 includes two multiplexers for each port. For instance, in the specific example shown in FIG. 1, the input selection module 140 has an address multiplexer 145 for port A, an address multiplexer 150 for port B, a write enable multiplexer 155 for port A, and a write enable multiplexer 160 for port B.

Port A address multiplexer 145 has two inputs. One of the multiplexer's inputs is connected to an external address signal through an interconnect 146, and the other one of the multiplexer's inputs is connected to an internal address signal through an interconnect 147. A control signal 148 is used to select which one of the two inputs is output to the output interconnect 149. The signal from the output interconnect 149 provides memory addressing information for port A to memory core 110.

Port B address multiplexer 150 is configured similarly to the port A address multiplexer 145. Port B address multiplexer 150 has a first input that is connected to an external address signal through an interconnect 151, and a second input that is connected to an internal address signal though an interconnect 152. A control signal 153 is used to select which one of the two inputs is output to the output interconnect 154, which provides memory addressing information for port B to memory core 110.

In some systems, addressing information from the internal address signal interconnects 147 and 152 are used to perform a test (e.g., a memory built-in self-test), while addressing information from the external address signal interconnects 146 and 151 are used when operating memory module 100 in a functional mode. In such a case, the interconnects 146 and 151, which are used in the functional mode, are not tested. However, as again will be described in greater detail below, certain embodiments of the present disclosure set the control signals 148 and 153 to transmit the addressing information from interconnects 146 and 151 when performing a test. Therefore, the same interconnects 146 and 151 that are used in the functional mode are also used during a test instead of being bypassed and not tested.

Port A write enable multiplexer 155 again has two inputs. One of the multiplexer's inputs is connected to an external write enable signal through an interconnect 156, and the other one of the multiplexer's inputs is connected an internal write enable signal through an interconnect 157. A control signal 158 is used to select which one of the two inputs is output to the output interconnect 159. The signal from the output interconnect 159 provides a write enable signal for port A of memory core 110.

Port B write enable multiplexer 160 is configured similarly to the port A multiplexer 155. Port B write enable multiplexer 160 has a first input that is connected to an external write enable signal through an interconnect 161, and a second input that is connected to an internal write enable signal through an interconnect 162. A control signal 163 is used to select which one of the two inputs is output to the output interconnect 164, which provides a write enable signal for port B of memory core 110.

In some systems, the write enable signals from the internal write enable interconnects 157 and 162 are used to perform a test (e.g., a memory built-in self-test), while the write enable signals from the external write enable interconnects 156 and 161 are used when operating memory module 100 in a functional mode. In such a case, the interconnects 156 and 161, which are used in the functional mode, are not tested. However, as again will be described in greater detail below, certain embodiments of the present disclosure set the control signals 158 and 163 to transmit the write enable signals from interconnects 156 and 161 when performing a test. Therefore, the same interconnects 156 and 161 that are used in the functional mode are also used during a test instead of being bypassed and not tested.

Memory mode selection module 170 selects which input signals are transmitted to memory module 100. In an embodiment, input signals can come from either operating the memory module 100 in a test mode (e.g., LBIST) or from operating the memory module 100 in a functional mode. As can be seen in the figure, regardless of which input signals are selected, the output signals 179, 184, 189, and 194 from memory mode selection module 170 are transmitted to the same interconnects (e.g., interconnects 146, 151, 156, and 161) of the memory module 100. Accordingly, the same memory module interconnects that are used in a functional mode (e.g., interconnects 146, 151, 156, and 161) can be used during a test.

In the example shown in the figure, memory mode selection module 170 includes four multiplexers 175, 180, 185, and 190. Multiplexer 175 receives addressing information for port A of the memory module 100 from a test mode through an interconnect 176 and addressing information for port A of the memory module 100 from a functional mode through an interconnect 177. A control signal 178 is used to select which one of the two inputs is output to the output interconnect 179, which provides memory addressing information for port A to memory module 100.

Multiplexer 180 receives addressing information for port B of the memory module 100 from a test mode through an interconnect 181 and addressing information for port B of the memory module 100 from a functional mode through an interconnect 182. A control signal 183 is used to select which one of the two inputs is output to the output interconnect 184, which provides memory addressing information for port B to memory module 100.

Multiplexer 185 receives write enable signals for port A of the memory module 100 from a test mode through an interconnect 186 and write enable signals for port A of the memory module 100 from a functional mode through an interconnect 187. A control signal 188 is used to select which one of the two inputs is output to the output interconnect 189, which provides a write enable signal for port A to memory module 100.

Multiplexer 190 receives write enable signals for port B of the memory module 100 from a test mode through an interconnect 191 and write enable signals for port B of the memory module 100 from a functional mode through an interconnect 192. A control signal 193 is used to select which one of the two inputs is output to the output interconnect 194, which provides a write enable signal for port B to memory module 100.

Figure 2:
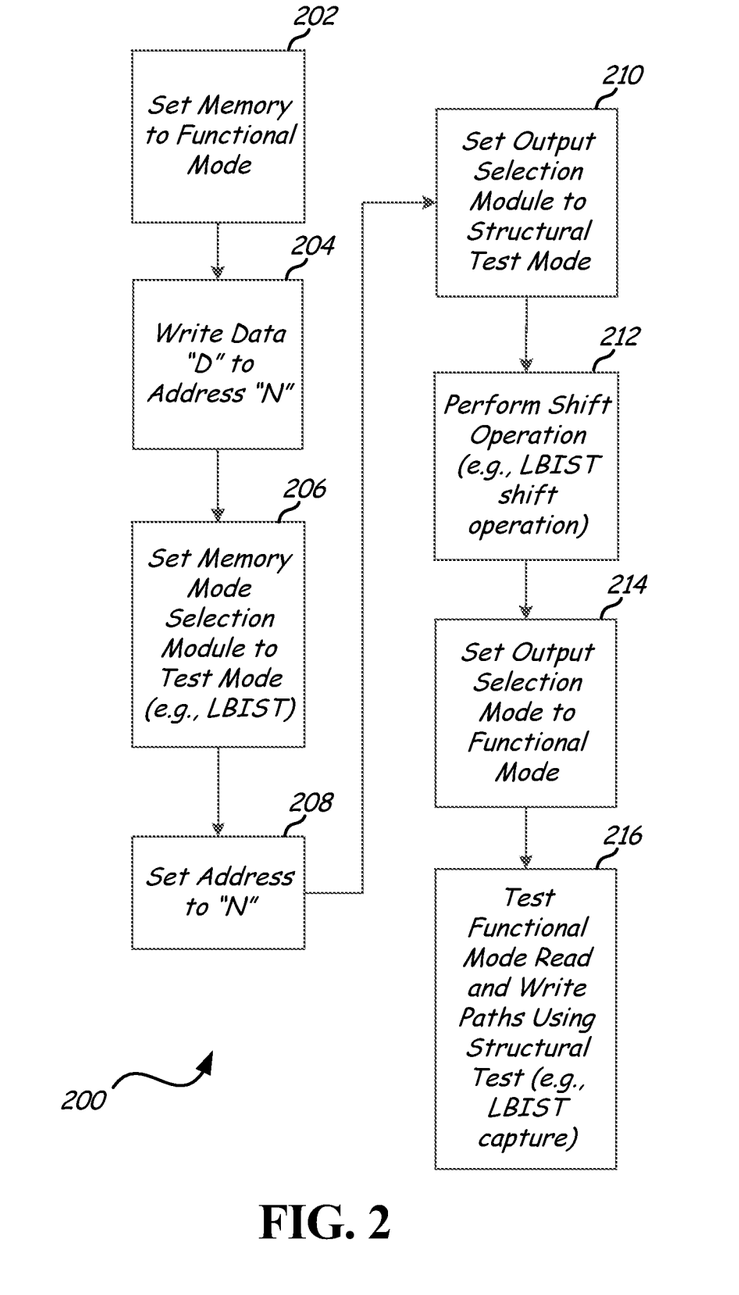
FIG. 2 is a flowchart of an embodiment of a method of operating memory in a functional mode while performing a structural test.

FIG. 2 is a flowchart of one embodiment of a method 200 of operating memory in a functional mode while performing a structural test (e.g., LBIST). At block 202, a memory is set to a functional mode. For example, in the embodiment shown in FIG. 1, setting the memory to the functional mode includes setting memory mode selection module 170 to output the functional mode signals from interconnects 177, 182, 187, and 192, setting input selection module 140 to output the functional mode signals from interconnects 146, 151, 156, and 161, and setting output selection module 120 to output the memory core signal from interconnect 115.

At block 204, a set of data labeled "D" is written to a portion of the memory core having an address labeled "N," where "D" can be any set of data and "N" can be the memory address or addresses of any portions of the memory core, thus every portion of the memory core can be tested.

At block 206, the memory mode selection module is set to a test mode (e.g., an LBIST mode). For example, in the embodiment shown in FIG. 1, setting the memory selection module to the test mode includes setting memory mode selection module 170 to output the test mode signals from interconnects 176, 181, 186, and 191.

At block 208, while in the test mode, the address of the memory core is set to the same address "N" specified at block 204. As stated previously, "N" can correspond to any address or addresses of the memory core.

At block 210, the output selection module is set to the test mode. For example, in the embodiment shown in FIG. 1, setting the output selection module to the test mode includes setting control signal 122 to transmit the flip-flop signal from interconnect 135 to the output interconnect 125.

At block 212, a shift operation (e.g., an LBIST shift operation) is performed after the output selection mode is set to the test mode at block 210. For example, in the embodiment shown in FIG. 1, after the output selection module 120 is set to the test mode by control signal 122, the contents of the flip-flop 130 are sent from interconnect 135 to the output interconnect 125. The signal from the output interconnect 125 is sent downstream to logic circuitry (not shown in FIG. 1) that uses the signal to perform a shift operation.

At block 214, the output selection module is set to the functional mode. For example, in the embodiment shown in FIG. 1, the control signal 122 of output selection module 120 is set such that the memory core signal from interconnect 115 is transmitted to the output interconnect 125.

At block 216, the memory functional mode read and write paths are tested using a structural test (e.g., LBIST). For example, in the embodiment shown in FIG. 1, the test mode signals from interconnects 176, 181, 186, and 191 are sent through memory mode selection module 170 to the memory module 100's functional mode input interconnects 146, 151, 156, and 161. The test mode signals travel through the functional mode read and write paths of the memory module 100 (e.g., interconnects 146, 149, 151, 154, 156, 159, 161, 164, 115, and 125) and are output to downstream circuitry through output interconnect 125. Accordingly, a structural test may be performed while operating the memory in the functional mode. It should be highlighted that interconnects 146, 151, 156, 161, and 115 are used in this testing. Other methods of performing structural testing (e.g., at least certain LBIST and MBIST techniques) have bypassed and not tested these interconnects. Additionally, it should also be highlighted that this technique may reduce test times and improve the ability to correlate tests by performing a memory functional test with a structural test (e.g., LBIST) at the same time and using the same paths. In other words, embodiments of the present disclosure enable the same read and write paths that are used in a functional test (i.e., the functional mode read and write paths) to be used while performing a structural test. For instance, data read from memory core 110 is used to perform a structural test instead of data read from flip-flop 130. Accordingly, a functional test and a structural test may be better correlated, because the structural test will use the same memory read and write paths as the functional mode/functional test instead of using different read and write paths.

Figure 3:
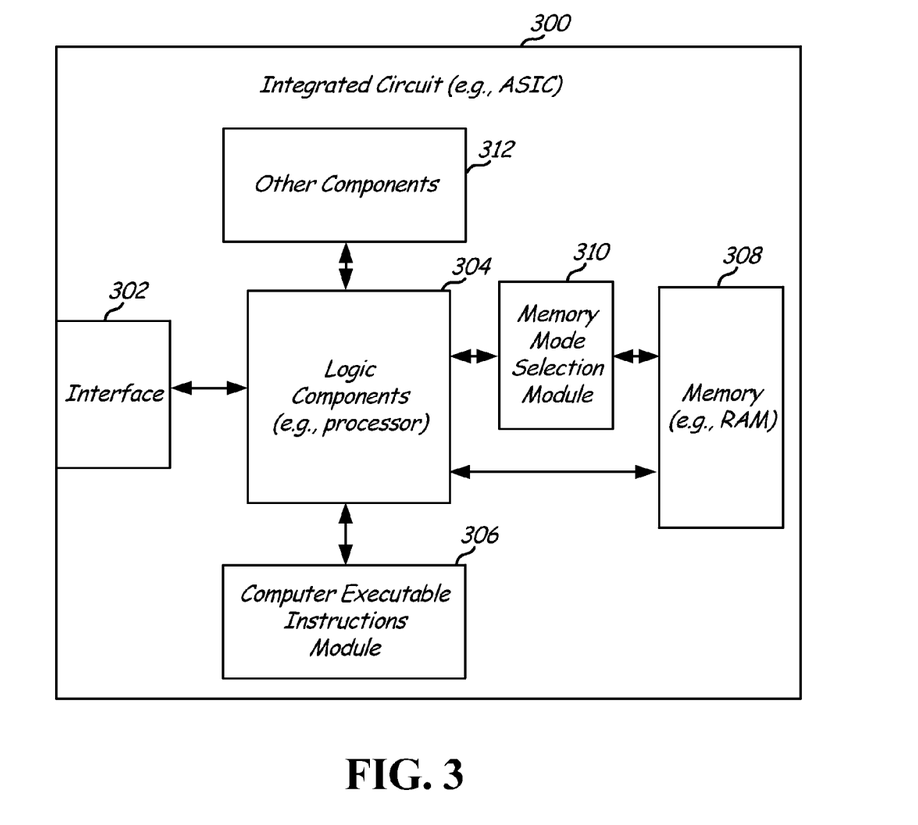
FIG. 3 is a schematic diagram of an embodiment of an integrated circuit.

FIG. 3 illustrates a schematic diagram of an integrated circuit 300 (e.g., an application specific integrated circuit) suitable for implementing one or more embodiments of the components and methods disclosed herein. Embodiments are not however limited to any specific implementations and can be used in circuits differing from the specific example shown in the figure.

Integrated circuit (IC) 300 includes an interface 302, logic components 304, computer executable instructions 306, memory 308, memory mode selection module 310, and other components 312. Interface 302 enables IC 300 to send and receive signals from other components within a board or system that IC 300 is incorporated within. Logic components 304 perform logic and other processing functions required by IC 300, and computer executable instructions 306 include instructions for performing IC 300's operations. For example, computer executable instructions 306 can include the instructions needed to perform the method shown in FIG. 2.

Memory 308 provides memory (e.g., random access memory) for IC 300. For instance, memory 308 may be configured the same or similarly to memory module 100 in FIG. 1 and provide capabilities to store and retrieve data from a memory core. IC 300 optionally includes a memory mode selection module 310 that connects an output signal from logic components 304 to an input signal of memory 308. In certain embodiments, memory mode selection module 310 is configured the same or similarly to memory mode selection module 120 in FIG. 1 and enables the input signal to memory 308 to be switched between receiving signals from a functional mode and receiving signals from a test mode. Accordingly, memory mode selection module 310 can be used to implement operating memory 308 in a functional mode while performing a structural test.

Finally with respect to FIG. 3, memory 308 can include other components 312. Other components 312 represent the fact that IC 300 can have any other desired components as needed to implement any functionality. The simplified IC 300 shown here is merely intended to illustrate some general components that may be included in an IC that implements the testing components and methods described in this disclosure. Embodiments of this disclosure are not limited to any particular IC configuration and can be implemented in a wide range of settings.

Figure 4:
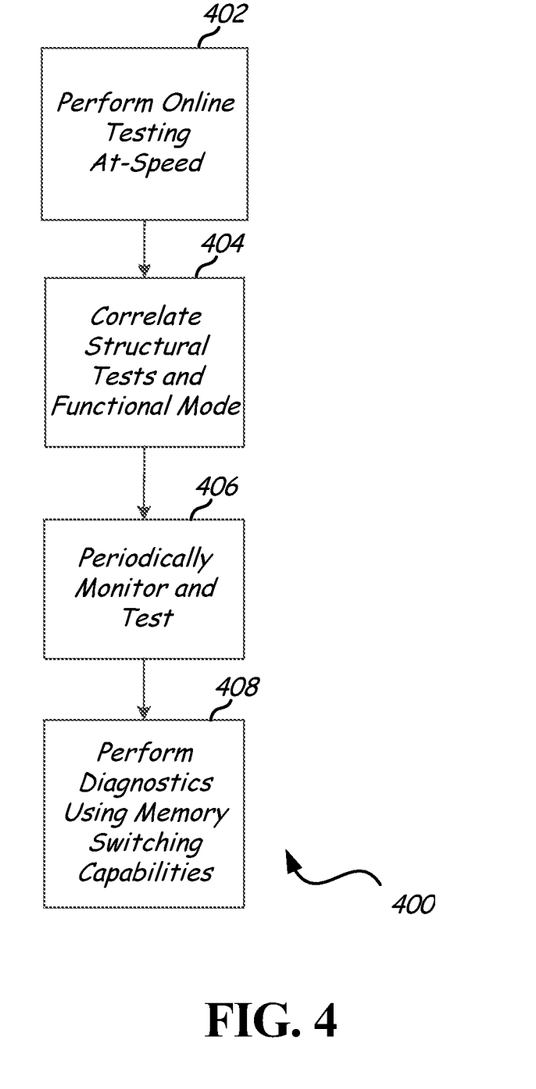
FIG. 4 is a flowchart of an embodiment of a method of testing and diagnosing an integrated circuit.

FIG. 4 is a flowchart of one embodiment of a method 400 of testing and diagnosing an integrated circuit. Method 400 illustrates some features that can be implemented by operating memory in a functional mode while performing a structural test. At block 402, the testing methods and components described herein are used to perform online testing at-speed. For instance, a memory module is tested at normal operating speeds while it is connected to and is operable within a board or larger system. No new offline tests or equipment are needed. This may be beneficial in reducing test times and lowering costs.

At block 404, correlations are made between structural tests and the functional mode. In at least certain circumstances, better test and functional correlations can be made based on the fact that the memory read and write circuitry is the same for both the structural tests and the functional mode. In one embodiment, correlations can be determined by triggering and observing test results while operating a memory in a functional mode to achieve the test results. Improved test and functional mode correlations can help reduce testing and debugging time.

At block 406, periodic monitoring and testing is performed. This can be performed online as described at block 402. The periodic monitoring and testing may be useful to detect and to provide notifications about potential aging issues or defects before a component failure occurs, thus improving system reliability.

At block 408, diagnostics are performed by using the memory mode switching capabilities. For instance, a write enable signal (e.g., signals from interconnects 189 and 194 in FIG. 1) can be controlled by a user to enable or disable memory read and/or write operations for debugging purposes. Accordingly, this can also help reduce testing and debugging time.

As has been described above, systems and methods are disclosed herein that enable operating memory in a functional mode while performing a structural test such as, but not limited to, a logic built-in self-test (LBIST). In one embodiment, logic circuitry is added to an integrated circuit (e.g., an application specific integrated circuitry) that enables the contents of a memory to be written to or read from while performing a structural test. Additionally, the added logic circuitry may be incorporated into the integrated circuit such that the same read and write paths that are used by the memory while in a functional mode are used during the structural test. This may help improve test coverage by testing paths that are not normally tested. This may also enable better correlation between structural and functional tests, which can assist in troubleshooting a component failure. Additionally, test time can be reduced by combining the structural and performance tests and by being able to perform the testing at normal operating speeds (e.g., the test can be performed "at-speed"). Some of the other features and advantages include being able to perform online testing, being able to periodically monitor and test systems, and being able to perform diagnostics using the memory mode switching capabilities.

Figure 5:
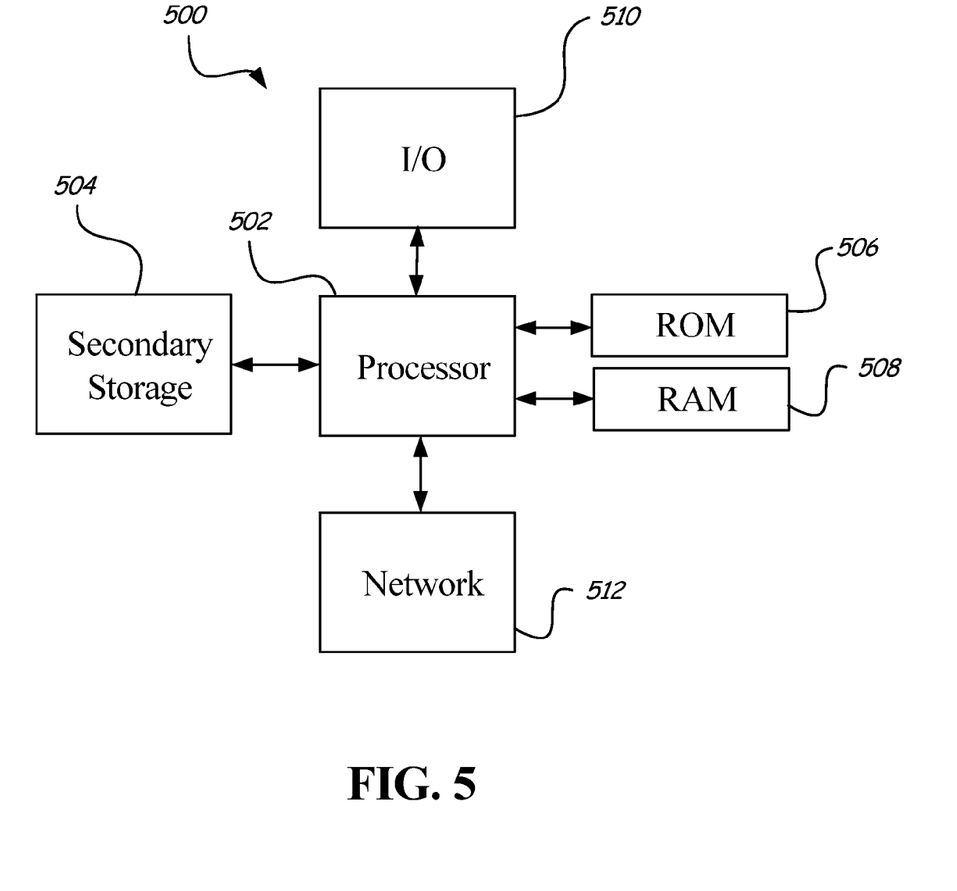
FIG. 5 is a schematic diagram of an embodiment of a general-purpose computer system.

The methods and components described above may be implemented on any general-purpose network component, such as a computer or network component with sufficient processing power, memory resources, and network throughput capability to handle the necessary workload placed upon it. FIG. 5 illustrates a schematic diagram of a general-purpose network component or computer system 500 suitable for implementing one or more embodiments of the methods or components disclosed herein. The general-purpose network component or computer system 500 includes a processor 502 (which may be referred to as a central processor unit or CPU) that is in communication with memory devices including secondary storage 504, read only memory (ROM) 506, random access memory (RAM) 508, input/output (I/O) devices 510, and network connectivity devices 512. Although illustrated as a single processor, the processor 502 is not so limited and may comprise multiple processors. The processor 502 may be implemented as one or more general-purpose CPU chips, cores (e.g., a multi-core processor), field-programmable gate arrays (FPGAs), ASICs, and/or digital signal processors (DSPs), and/or may be part of one or more ASICs. The processor 502 may be configured to implement any of the schemes described herein. The processor 502 may be implemented using hardware, software, or both.

The secondary storage 504 is typically comprised of one or more disk drives or tape drives and is used for non-volatile storage of data and as an over-flow data storage device if the RAM 508 is not large enough to hold all working data. The secondary storage 504 may be used to store programs that are loaded into the RAM 508 when such programs are selected for execution. The ROM 506 is used to store instructions and perhaps data that are read during program execution. The ROM 506 is a non-volatile memory device that typically has a small memory capacity relative to the larger memory capacity of the secondary storage 504. The RAM 508 is used to store volatile data and perhaps to store instructions. Access to both the ROM 506 and the RAM 508 is typically faster than to the secondary storage 504.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 70 percent, 71 percent, 72 percent, . . . , 95 percent, 96 percent, 97 percent, 98 percent, 99 percent, or 100 percent. Moreover, any numerical range defined by two R numbers as defined in the above is also specifically disclosed. The use of the term about means ±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method for testing an integrated circuit having memory comprising:
   setting the memory to operate in a functional mode;
   writing data to the memory while in the functional mode;
   reading the data from the memory while in the functional mode; and
   using the data read from the memory to perform a structural test on read and write paths of the memory on the integrated circuit while the integrated circuit is in the functional mode,
   wherein the read and write paths structurally tested are the same as those used by the memory while the integrated circuit is in the functional mode.

2. The method of claim 1, wherein using the data comprises transmitting the data to downstream logic components and using the data to perform a logic built-in self-test.

3. The method of claim 1, wherein using the data comprises using the data to perform an at-speed online test.

4. The method of claim 1, wherein using the data comprises periodically using the data to monitor and test the integrated circuit.

5. The method of claim 1, wherein writing the data to the memory comprises receiving the data from a memory mode selection module configured to selectively transmit data from either the functional mode or from a structural mode.

6. The method of claim 1, wherein reading the data from the memory comprises receiving the data from an output selection module configured to selectively transmit data from either the functional mode or from a structural mode.

7. An integrated circuit comprising:
   a memory mode selection circuit configured to receive a functional mode signal and a test mode signal and selectively transmit either the functional mode signal or the test mode signal based on a state of a control signal;
   a memory circuit configured to receive either the functional mode signal or the test mode signal from the memory mode selection circuit and store data corresponding to either the functional mode signal or the test mode signal to memory cells in a memory core of the memory circuit; and
   an output selection circuit configured to receive the data from the memory cells and transmit the data to downstream circuitry so that a structural test may be performed on read and write paths of the memory while the integrated circuit is in the functional mode,
   wherein the read and write paths structurally tested are the same as those used by the memory while the integrated circuit is in the functional mode.

8. The integrated circuit of claim 7, further comprising a computer executable instructions circuit configured to store instructions that enable the integrated circuit to operate the memory circuit in the functional mode while performing the structural test.

9. The integrated circuit of claim 7, wherein the downstream circuitry comprises logic circuitry configured to use the data from the memory cells to perform the structural test.

10. The integrated circuit of claim 9, wherein the structural test is a logic built-in self-test.

11. The integrated circuit of claim 7, wherein the output selection circuit is configured to receive the data from the memory cells and data from a flip-flop and selectively transmit either the data from the memory cells or the data from the flip-flop.

12. The integrated circuit of claim 7, wherein the memory circuit further comprises an input selection circuit configured to receive the signals from the memory mode selection circuit and signals from internal interconnects and selectively transmit either the signals from the memory mode selection circuit or the signals from the internal interconnects.

13. An integrated circuit comprising:
    memory; and
    a processor configured to perform a structural test on read and write paths of the memory on the integrated circuit using data obtained from operating the memory in a functional mode and while the integrated circuit is in the functional mode,
    wherein the read and write paths structurally tested are the same as those used by the memory while the integrated circuit is in the functional mode.

14. The integrated circuit of claim 13, wherein the processor is configured to write the data to a specified portion of the memory while operating the memory in the functional mode.

15. The integrated circuit of claim 14, wherein the memory is configured to switch the memory to operate in a structural mode while performing a shift operation.

16. The integrated circuit of claim 15, wherein the memory is configured to return to operating in the functional mode and transmit the data to downstream circuitry.

17. The integrated circuit of claim 16, wherein the data is configured to be used by the downstream circuitry to perform a logic built-in self-test.

18. The integrated circuit of claim 17, wherein the logic built-in self-test is periodically repeated at-speed in an online environment.

19. The integrated circuit of claim 18, wherein the processor is configured to use mode switching capabilities of the integrated circuit to diagnose a failure of the logic built-in self-test.

20. The integrated circuit of claim 19, wherein the processor is configured to correlate the structural test and the functional mode by triggering and observing test results while operating the integrated circuit in the functional mode.

* * * * *